(12) United States Patent
Fukuhara et al.

(10) Patent No.: US 11,804,822 B2
(45) Date of Patent: Oct. 31, 2023

(54) SURFACE ACOUSTIC WAVE RESONATOR WITH REDUCED FREQUENCY SHIFT

(71) Applicant: SKYWORKS SOLUTIONS, INC., Irvine, CA (US)

(72) Inventors: Hironori Fukuhara, Ibaraki (JP); Keiichi Maki, Suita (JP); Yuya Hiramatsu, Neyagawa (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 333 days.

(21) Appl. No.: 17/076,934

(22) Filed: Oct. 22, 2020

(65) Prior Publication Data

US 2021/0126617 A1 Apr. 29, 2021

Related U.S. Application Data

(60) Provisional application No. 62/924,773, filed on Oct. 23, 2019.

(51) Int. Cl.
| | |
|---|---|
| *H03H 9/25* | (2006.01) |
| *H03H 9/02* | (2006.01) |
| *H03H 9/72* | (2006.01) |
| *H03H 9/64* | (2006.01) |
| *H03H 9/145* | (2006.01) |

(52) U.S. Cl.
CPC .......... *H03H 9/25* (2013.01); *H03H 9/02559* (2013.01); *H03H 9/02834* (2013.01); *H03H 9/14541* (2013.01); *H03H 9/6483* (2013.01); *H03H 9/725* (2013.01)

(58) Field of Classification Search
CPC ............... H03H 9/25; H03H 9/64; H03H 9/72
See application file for complete search history.

(56) References Cited

U.S. PATENT DOCUMENTS

| | | | | |
|---|---|---|---|---|
| 5,726,610 | A * | 3/1998 | Allen | H03H 9/6483 333/133 |
| 9,035,725 | B2 * | 5/2015 | Komatsu | H03H 9/02858 333/193 |
| 9,640,750 | B2 * | 5/2017 | Nakanishi | H03H 9/02834 |
| 9,748,924 | B2 * | 8/2017 | Komatsu | H10N 30/87 |
| 10,938,371 | B2 * | 3/2021 | Nakamura | H03H 9/02858 |
| 2016/0065162 | A1 | 3/2016 | Zinke et al. | |
| 2017/0222622 | A1 | 8/2017 | Solal et al. | |

* cited by examiner

*Primary Examiner* — Andrea Lindgren Baltzell
*Assistant Examiner* — Alan Wong
(74) *Attorney, Agent, or Firm* — Lando & Anastasi, LLP

(57) ABSTRACT

Aspects of this disclosure relate to a surface acoustic wave resonator. The surface acoustic wave resonator includes a piezoelectric substrate, interdigital transducer electrodes formed on an upper surface of the piezoelectric substrate, a dielectric temperature compensation layer formed on the piezoelectric substrate to cover the interdigital transducer electrodes, and a dielectric passivation layer over the temperature compensation layer. The passivation layer may include an oxide layer configured to have a sound velocity greater than that of the temperature compensation layer to suppress a transverse signal transmission.

15 Claims, 8 Drawing Sheets

SURFACE ACOUSTIC WAVE RESONATOR WITH REDUCED FREQUENCY SHIFT

CROSS-REFERENCE TO RELATED APPLICATIONS

The present application claims priority under 35 U.S.C. § 119(e) to U.S. Provisional Patent Application Ser. No. 62/924,773, titled SURFACE ACOUSTIC WAVE RESONATOR WITH REDUCED FREQUENCY SHIFT, filed Oct. 23, 2019, the entire contents of which being incorporated by reference herein for all purposes.

BACKGROUND

Technical Field

Embodiments of this disclosure relate to surface acoustic wave (SAW) resonators, and filters, duplexers, and wireless devices using same.

Description of Related Technology

Surface acoustic wave (SAW) resonators may be used in filters, duplexers and the like included in wireless devices for mobile communication. An example of a SAW resonator includes a substrate formed of lithium niobate ($LiNbO_3$) and a silicon dioxide ($SiO_2$) film formed on an upper surface of the substrate for temperature compensation.

FIG. 1A is a top view illustrating an electrode arrangement in a SAW resonator 110 and FIG. 1B is a cross sectional view taken along line I-I shown in FIG. 1A. In the SAW resonator 110, interdigital transductor (IDT) electrodes 113 are formed on an upper surface of a piezoelectric substrate 111 of $LiNbO_3$. The IDT electrodes 113 include a bus bar electrode region 121 where a pair of bus bar electrodes 113a are formed, an overlapping region 122 where electrode fingers 113b overlap with each other, and a gap region 123 between tips of the electrode fingers 113b and a bus bar electrode 113. These regions are arranged in a transverse direction to the direction of propagation of an excited acoustic wave passing through the resonator 110. It should be appreciated that, as described hereafter, the transverse direction to the direction of propagation of the acoustic wave excited by the IDT electrodes 113 may be referred to merely as the transverse direction of the IDT electrodes 113.

The IDT electrodes 113 are formed, for example, by depositing an aluminum (Al) layer $113_2$ having lower density and higher electrical conductivity on a molybdenum (Mo) layer $113_1$ having higher density and lower electrical conductivity such that the total electromechanical coupling and electrical conductivity can be ensured to be within desired ranges. A temperature compensation layer 115 formed of silicon dioxide ($SiO_2$) is formed on the upper surface of the piezoelectric substrate 111 to cover the IDT electrodes 113. The temperature compensation layer 115 may have a positive temperature coefficient of frequency to compensate the frequency temperature characteristics of the piezoelectric substrate 111 having a negative temperature coefficient of frequency. The temperature compensation layer 115 is covered with a silicon nitride (SiN) layer 118 and a silicon oxynitride (SiON) layer 119.

The SiN layer 118 includes a trench region 125 having a trench 118a formed to reduce the thickness of the SiN layer 118 within a certain area including the gap region 123 in the transverse direction of the IDT electrodes 113 and adjusts the frequency characteristics of the SAW resonator 110 by the layer thickness. The structure of the trench 118a may generate a piston mode within the trench region 125 and serve to suppress a spurious response originated from a high-order transverse mode of the IDT electrodes 113. The SiON layer 119 may serve as a passivation layer protecting the SiN layer 118 to prevent the SiN layer 118 from being oxidized by a surface modification treatment using oxygen ($O_2$) plasma in a backend process and thus allowing the resonance frequency and/or anti-resonance frequency to shift.

SUMMARY

The SiON layer 119 may be oxidized when exposed to oxygen plasma such that the resonance frequency and/or anti-resonance frequency may shift. FIG. 2 is a graph illustrating pass characteristics of the SAW resonator 110 before and after the oxygen plasma treatment as a function of frequency. The SAW resonator 110 includes the SiON layer 119 having a thickness of 7 nanometer (nm) and covering the trench 118a with the same thickness. The values before the oxygen plasma treatment are indicated by dashed lines and those after the oxygen plasma treatment are indicated by solid lines. Curves (a) corresponds to the scale on the left vertical axis, whereas curves (b) obtained enlarging curves (a) in the vertical axis direction corresponds to the scale on the right vertical axis. As can be seen, the oxygen plasma treatment may cause the pass characteristic of the SAW resonator 110 to shift lower in frequency.

Further, there are needs for frequency characteristics of SAW resonators to be adjusted to suppress a spurious response originated from a high-order transverse mode, and to be provided with a passivation layer for ensuring reliability.

In view of the above, aspects of the present disclosure include a SAW resonator as well as a filter, a duplexer, and a wireless device using the same. The SAW resonator is configured to not only prevent a frequency shift in its passband even though exposed to oxygen plasma during the backend process, but also to allow the frequency characteristic to be adjusted, the spurious response originated from the high-order transverse mode to be suppressed, and a passivation layer to be provided for ensuring reliability.

To solve the above-mentioned problem, aspects of this disclosure include a surface acoustic wave resonator. The surface acoustic wave resonator includes a piezoelectric substrate, interdigital transducer electrodes formed on an upper surface of the piezoelectric substrate, a dielectric temperature compensation layer formed on the piezoelectric substrate to cover the interdigital transducer electrodes, and a dielectric passivation layer over the temperature compensation layer. The passivation layer may include an oxide layer configured to have a sound velocity greater than that of the temperature compensation layer to suppress a transverse signal transmission.

The interdigital transducer electrodes may include a bus bar electrode region, a gap region, and an overlapping region in a transverse direction to a propagation direction of a surface acoustic wave to be excited, and the oxide layer may include a trench region having a trench recessed to reduce a thickness of the oxide layer within a certain area extending in the transverse direction and including the gap region in the interdigital transducer electrode.

A dielectric intermediate layer formed over the temperature compensation layer may be covered with the passivation layer. The interdigital transducer electrode may include the bus bar electrode region, the gap region, and the overlapping region in the transverse direction, and the intermediate layer may include a trench region having a trench recessed to reduce a thickness of the intermediate layer within a certain area extending in the transverse direction and including the gap region in the interdigital transducer electrodes.

The trench region may include the gap region and respective areas in the bus bar region and the overlapping region adjacent to the gap region respectively by a certain distance from the gap region in the transverse direction.

The piezoelectric substrate may be formed of lithium niobate. The temperature compensation layer may be formed of silicon oxide. The oxide layer may be formed of aluminum oxide. The intermediate layer may be formed of silicon oxynitride.

The interdigital transducer electrodes may include molybdenum. The interdigital transducer electrodes may include molybdenum deposited with aluminum.

Aspects of this disclosure provide a filter including the surface acoustic wave resonator. The filter may be a ladder filter. The filter may be a longitudinal-mode filter.

Aspects of this disclosure include a duplexer having a transmit filter and a receive filter in at least one of which the SAW resonator is used.

Aspect of this disclosure include a wireless device that communicates by a frequency division bidirectional communication at a radio frequency and includes the duplexer.

BRIEF DESCRIPTION OF THE DRAWINGS

Embodiments of this disclosure will now be described, by way of non-limiting example, with reference to the accompanying drawings.

DETAILED DESCRIPTION

Figure 1A:
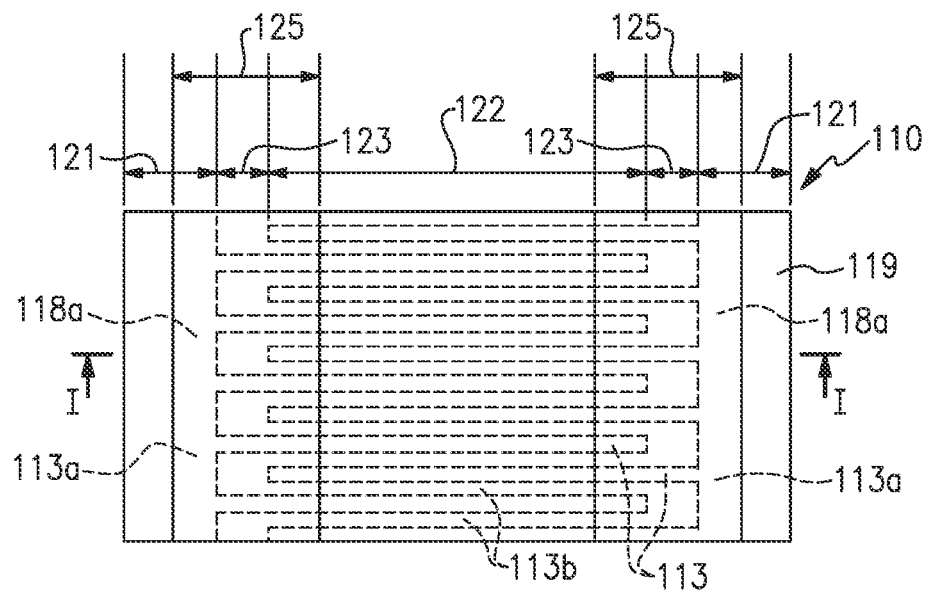
FIG. 1A is a top view illustrating an electrode arrangement in an example of a surface acoustic wave (SAW) resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Aspects of this disclosure relate to a surface acoustic wave (SAW) resonator, and a filter, a duplexer, and a wireless device using the SAW resonator.

Figure 3A:
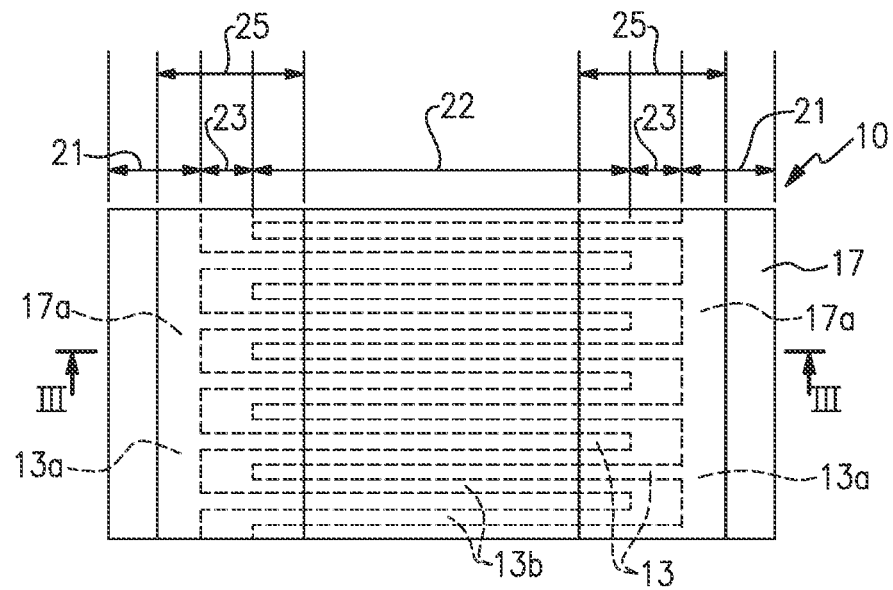
FIG. 3A is a top view illustrating an electrode arrangement in a SAW resonator according to an embodiment of the present disclosure.
Figure 3B:
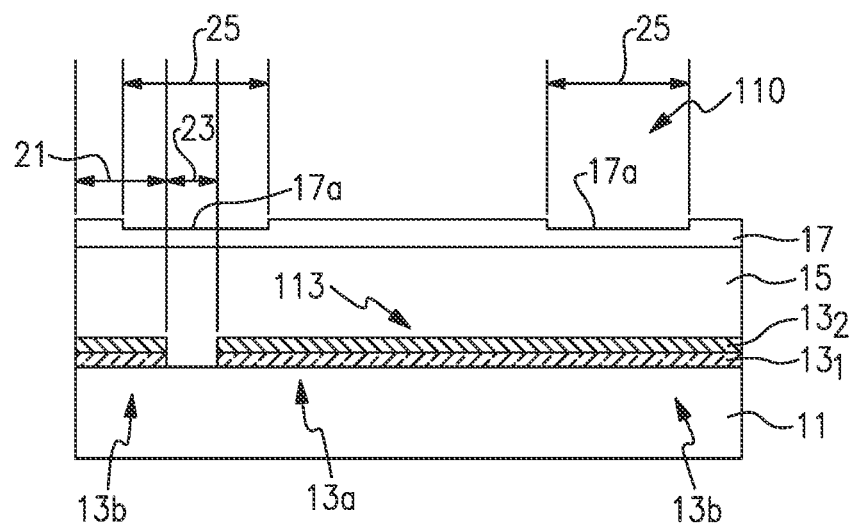
FIG. 3B is a cross sectional view of a SAW resonator according to an embodiment of the present disclosure.

FIG. 3A is a top view illustrating an electrode arrangement in a SAW resonator 10 according to an embodiment. FIG. 3B is a cross sectional view taken along line III-III shown in FIG. 3A. In the SAW resonator 10, interdigital transductor (IDT) electrodes 13 are formed on an upper surface of a piezoelectric substrate 11 having a certain thickness.

Although a portion where the IDT electrodes 13 are formed on the upper surface of the piezoelectric substrate 11 is depicted in the top view of FIG. 3A, the piezoelectric substrate 11 may outwardly extend in a propagation direction of an acoustic wave excited by the IDT electrode 13 or a transverse direction to the propagation direction. Further, a pair of reflection electrodes to reflect an acoustic wave may be formed to sandwich the IDT electrodes 13 therebetween in the propagation direction of the acoustic wave in a portion outwardly extended from a portion where the IDT electrode 13 is formed. This configuration is similar to another example SAW resonator described herein.

The piezoelectric substrate 11 may be, for example, a rotated Y-plate of $LiNbO_3$ with a cut angle of 128 degrees, which may have a greater electromechanical coupling coefficient ($k^2$) than $LiNbO_3$ substrates with other cut angles. The rotated Y-plate with a cut angle of 128 degrees can be expressed as (0°, 128°-90°, 0°) using the Euler angles ($\varphi$, $\theta$, $\psi$). Here, although the rotated Y-cut with a cut angle of $\alpha$ can be expressed as (0°, $\alpha$-90°, 0°) using the Euler angles ($\varphi$, $\theta$, $\psi$), the Euler angles (0°, $\alpha$+90°, 0°) may also provide the same properties. As described herein, the former expression (0°, $\alpha$-90°, 0°) is to be used. The piezoelectric substrate 11 can be manufactured with another cut angle and using another material.

The IDT electrode 13 includes bus bar electrode regions 21 where a pair of bus bar electrodes 13a are formed separated from each other by a certain distance in the transverse direction to the propagation direction of a SAW to be excited in the resonator 10, an overlapping region 22 where electrode fingers 13b extending in opposite directions from their respective bus bar electrodes 13a overlap with each other, and gap regions 23 formed between tips of the electrode fingers 13b and opposite bus bar electrodes 13a, i.e., between the overlapping region 22 and the bus bar electrode regions 21. In the overlapping region 22, the electrode fingers 13b extend from a respective bus bar electrode 13a toward the opposite bus bar electrode 13a, and the electrode fingers 13b extending from the opposite bus bar electrodes 13a are alternately arranged at a certain pitch in the propagation direction of a surface acoustic wave. The IDT electrode 13 is formed, for example, by depositing an aluminum (Al) layer $13_2$ having lower density and higher electrical conductivity on a molybdenum (Mo) layer $13_1$ having higher density and lower electrical conductivity such that the total electromechanical coupling and electrical conductivity can be ensured to be within desired ranges.

On the upper surface of the piezoelectric substrate 11, a temperature compensation layer 15 of silicon oxide ($SiO_2$) having a certain thickness is formed to cover the IDT electrodes 13. The temperature compensation layer 15 may have a positive temperature coefficient of frequency to compensate the frequency temperature characteristics of the piezoelectric substrate 11 having a negative temperature coefficient of frequency.

The temperature compensation layer 15 is covered with an aluminum oxide ($Al_2O_3$) layer 17 that may have a sound velocity greater than the temperature compensation layer 15 and a thickness less than the thickness of the temperature compensation layer 15. The $Al_2O_3$ layer 17 is an oxide layer that serves as a passivation layer that may not be oxidized even though exposed to oxygen plasma during the surface modification treatment in the backend process and may protect the temperature compensation layer 15, and thus ensure a reliability of the SAW resonator 10.

The $Al_2O_3$ layer 17 includes trench regions 25 each having a trench 17a recessed from the upper surface of the $Al_2O_3$ layer 17. The trench region 25 includes a gap region 23 and a certain area extending from the gap region 23 to the bus bar region 21 and the overlapping region 22 respectively by a certain distance in the transverse direction of the IDT electrodes 13 to reduce the thickness of the $Al_2O_3$ layer 17. Such a structure of the trench 17a may generate a piston mode by which oscillation energy of a surface acoustic wave in the transverse direction of the IDT electrodes 13 is substantially uniformly distributed within the trench 17a, and may suppress a spurious response originating from a high-order transverse mode.

Further, the thickness of the $Al_2O_3$ layer 17 to be formed can be controlled to adjust the frequency characteristics of the SAW resonator 10. For example, forming the $Al_2O_3$ layer thickness greater may decrease the frequency, whereas forming the $Al_2O_3$ layer thickness lesser may increase the frequency.

Figure 4:
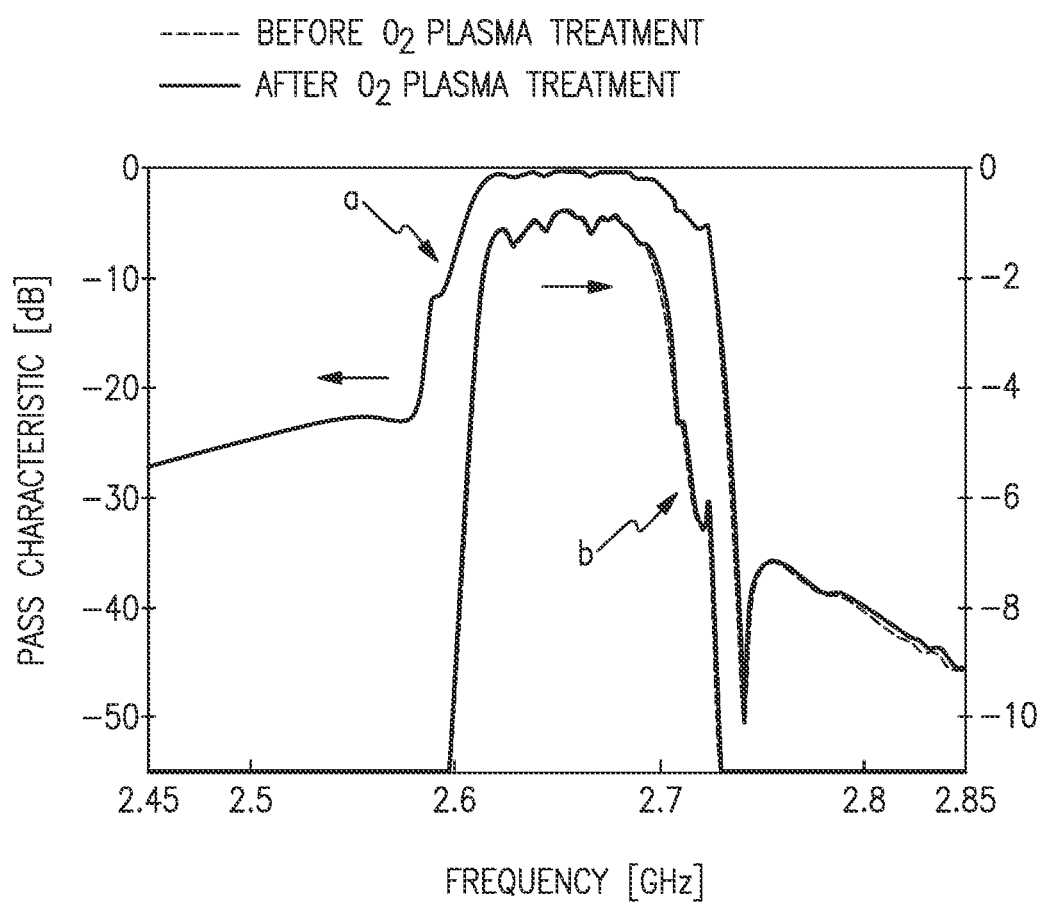
FIG. 4 is a graph illustrating a pass characteristic of a SAW resonator according to an embodiment of the present disclosure.

FIG. 4 is a graph illustrating pass characteristics as a function of frequency of the SAW resonator 10 shown in FIGS. 3A and 3B before and after the oxygen plasma treatment. In the SAW resonator 10, the $Al_2O_3$ layer 17 has a thickness of 5 nm and is thinner in the trench 17a. The values before the oxygen plasma treatment are indicated by dashed lines and those after the oxygen plasma treatment are indicated by solid lines. Curves (a) corresponds to the scale on the left vertical axis. Curves (b) are obtained by enlarging curves (a) in the vertical axis direction and corresponds to the scale on the right vertical axis. As can be seen, the SAW resonator 10 is found to exhibit substantially no pass characteristic shift due to experiencing the oxygen plasma treatment.

Figure 5:
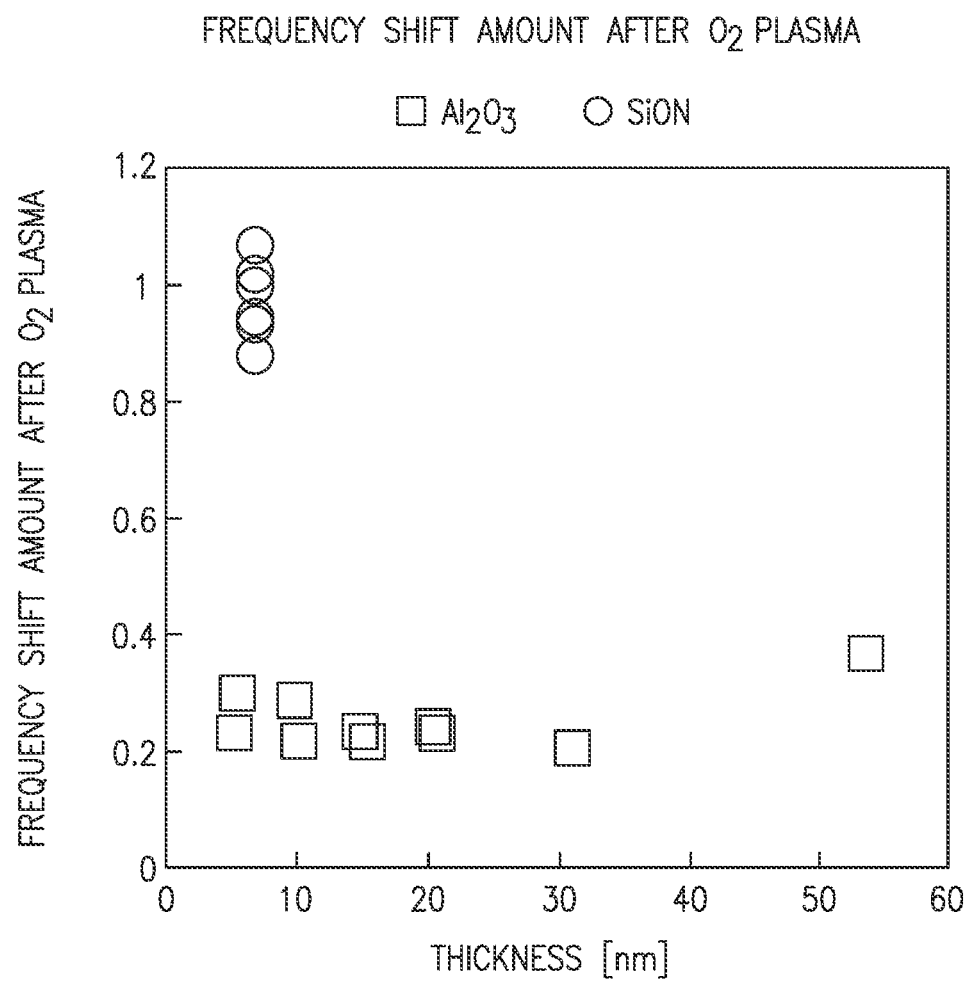
FIG. 5 is a graph illustrating a frequency shift amount obtained from a SAW resonator according to an embodiment of the present disclosure.

FIG. 5 is a graph illustrating an amount of frequency shift obtained from the SAW resonator 10 of FIGS. 3A and 3B before and after the oxygen plasma treatment. In the graph, the amount of frequency shift exhibited by the SAW resonator 10 of FIGS. 3A and 3B is indicated by square-shaped marks. As can be seen from the graph, the amount of frequency shift exhibited by the SAW resonator 10 including the $Al_2O_3$ layer 17 configured as passivation layer is 0.4 at greatest across a broad range of the thickness of the $Al_2O_3$ layer 17 from about 5 nm to about 55 nm.

Figure 1B:
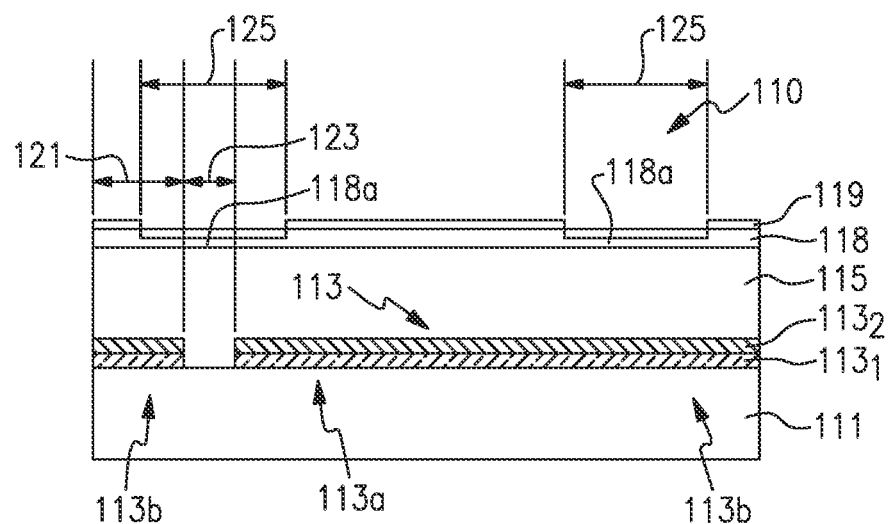
FIG. 1B is a cross sectional view of the SAW resonator of FIG. 1A.

In FIG. 5, the amount of frequency shift exhibited by the SAW resonator 110 of FIGS. 1A and 1B as a comparative example is also indicated by circle-shaped marks. The SAW resonator 110 including the SiON layer 119 as the passivation layer exhibits frequency shifts ranging from about 0.9 to about 1.1 when the thickness of the SiON layer 119 is about 5 nm.

It should be appreciated that, although the trench 17a is formed in the $Al_2O_3$ layer 17, the thickness of the layer can be constant without forming the trench 17a in the $Al_2O_3$ layer 17. In such a case, the $Al_2O_3$ layer 17 serves as a passivation layer that protects the temperature compensation layer 15 and thus ensure reliability of the SAW resonator 10, and the frequency characteristics can be adjusted by the thickness of the $Al_2O_3$ layer 17.

Figure 2:
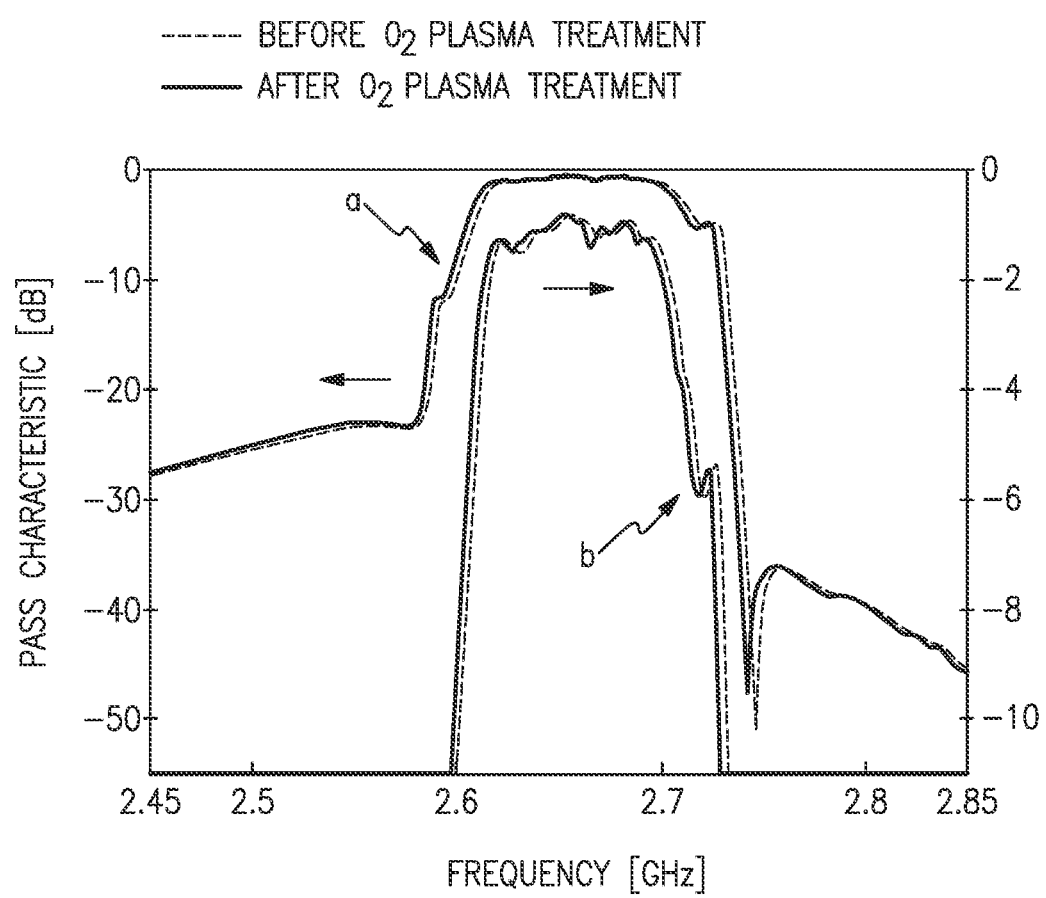
FIG. 2 is a graph illustrating a pass characteristic of the SAW resonator of FIG. 1A.
Figure 6A:
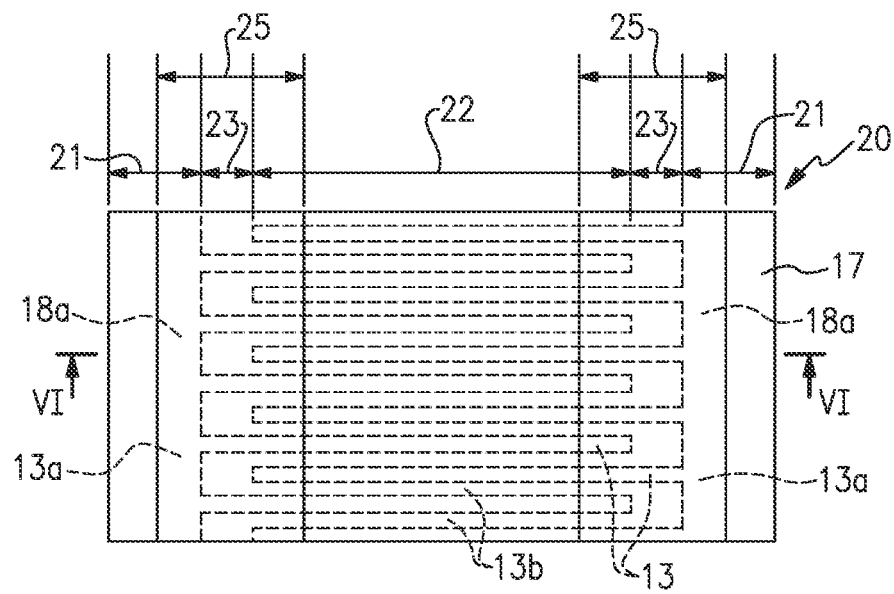
FIG. 6A is a top view illustrating an electrode arrangement in a SAW resonator according to an alternative embodiment of the present disclosure.
Figure 6B:
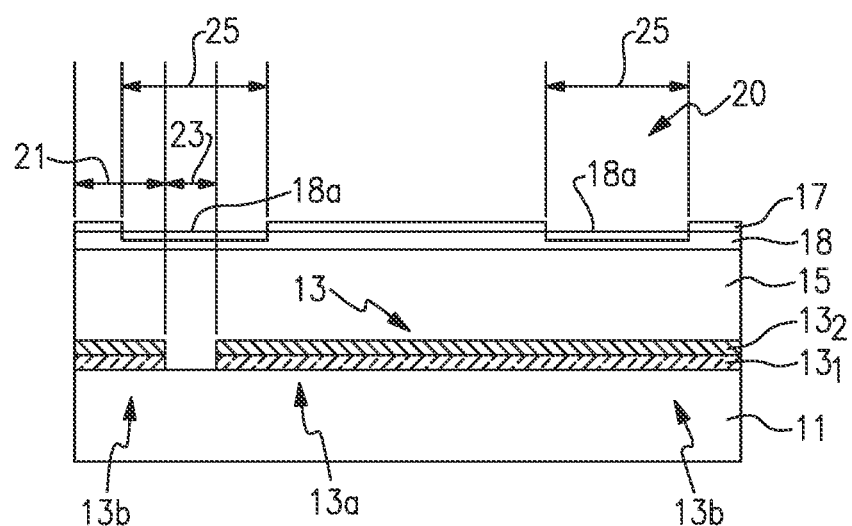
FIG. 6B is a cross sectional view of a SAW according to an alternative embodiment of the present disclosure.

FIG. 6A is a top view illustrating an electrode arrangement in a SAW resonator 20 according to another embodiment. FIG. 6B is a cross-sectional view taken along line VI-VI shown in FIG. 6A. In FIGS. 6A and 6B, like reference numerals are used to indicate corresponding components of the SAW resonator 10 illustrated in FIGS. 2A and 2B.

In the surface acoustic wave (SAW) resonator 20, interdigital transductor (IDT) electrodes 13 are formed on an upper surface of a piezoelectric substrate 11 having a certain thickness. The piezoelectric substrate 11 may be, for example, a rotated Y-plate of $LiNbO_3$ with a cut angle of 128 degrees, which may have a greater electromechanical coupling coefficient ($k^2$) than $LiNbO_3$ substrates with different cut angles. The rotated Y-plate with a cut angle of 128 degrees can be expressed as (0°, 128°-90°, 0°) using the Euler angles (φ, θ, ψ). It should be noted that the piezoelectric substrate 11 can be manufactured with another cut angle and using another material.

The IDT electrode 13 includes bus bar electrode regions 21 where a pair of bus bar electrodes 13a are formed separated from each other by a certain distance in the transverse direction to the propagation direction of a SAW to be excited in the resonator 20, an overlapping region 22 where electrode fingers 13b extending in opposite directions from their respective bus bar electrodes 13a overlap with each other, and gap regions 23 formed between tips of the electrode fingers 13b and opposite bus bar electrodes 13a, i.e., between the overlapping region 22 and the bus bar electrode regions 21. In the overlapping region 22, the electrode fingers 13b extend from a respective bus bar electrode 13a toward the opposite bus bar electrode 13a, and the electrode fingers 13b extending from the opposite bus bar electrodes 13a are alternately arranged at a certain pitch in the propagation direction of a surface acoustic wave. The IDT electrode 13 is formed, for example, by depositing an aluminum (Al) layer 13$_2$ having lower density and higher electrical conductivity on a molybdenum (Mo) layer 13$_1$ having higher density and lower electrical conductivity such that the total electromechanical coupling and electrical conductivity can be ensured to be within desired ranges.

On the upper surface of the piezoelectric substrate 11, a temperature compensation layer 15 of silicon oxide ($SiO_2$) having a certain thickness is formed to cover the IDT electrodes 13. The temperature compensation layer 15 may have a positive temperature coefficient of frequency to compensate the frequency temperature characteristics of the piezoelectric substrate 11 having a negative temperature coefficient of frequency.

The temperature compensation layer 15 is covered with a silicon nitride (SiN) layer 18 that may have a sound velocity greater than this temperature compensation layer 15 and a thickness less than the thickness of the temperature compensation layer 15. The SiN layer 18 is covered with an aluminum oxide ($Al_2O_3$) layer 17 that may have a sound velocity greater than the temperature compensation layer 15 and a thickness less than the thickness of the temperature compensation layer 15. The SiN layer 18 is configured as an intermediate layer disposed between the temperature compensation layer 15 and the $Al_2O_3$ layer 17. The $Al_2O_3$ layer 17 is an oxide layer that serves as a passivation layer that may not be oxidized even though exposed to oxygen plasma during the surface modification treatment in the backend process and may protect the SiN layer 18 and the temperature compensation layer 15, and thus ensure reliability of the SAW resonator 20.

The SiN layer 18 includes trench regions 25 each having a trench 18a recessed from the upper surface of the SiN layer 18. The trench regions 25 include a gap region 23 and a certain area extending from the gap region 23 to the bus bar region 21 and the overlapping region 22 respectively by a certain distance in the transverse direction of the IDT electrodes 13 to reduce the thickness of the SiN layer 18. Such a structure of the trench 18a may generate a piston mode by which oscillation energy of a surface acoustic wave in the transverse direction of the IDT electrodes 13 is substantially uniformly distributed within the trench 18a, and may suppress a spurious response originating from a high-order transverse mode. Further, the thickness of the SiN layer 18 to be formed can be controlled to adjust the frequency characteristics of the SAW resonator 20.

It should be appreciated that, although the trench 18a is formed in the SiN layer 18, the thickness of the layer can be constant without forming the trench 18a in the SiN layer 18. Even in such a case, the SiN layer 18 serves as a passivation layer that protects the temperature compensation layer 15, and the frequency characteristics can be adjusted by the thickness of the SiN layer 18. For example, forming the SiN layer thickness greater may decrease the frequency, whereas forming the SiN layer thickness lesser may increase the frequency.

Figure 7:
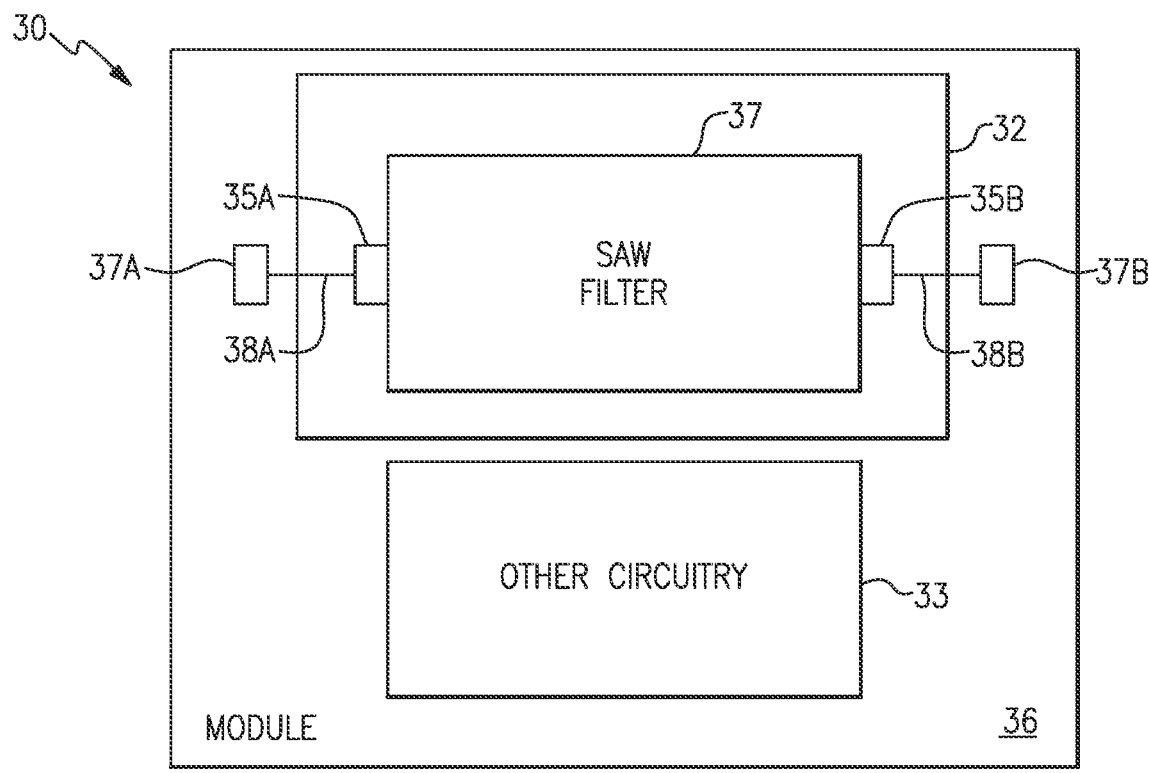
FIG. 7 is a schematic diagram of a radio frequency module that includes a SAW filter according to an embodiment of the present disclosure.

FIG. 7 is a block diagram illustrating a schematic configuration of a radio frequency module 30 that includes a SAW filter 37 which may include a SAW resonator according to an embodiment disclosed herein. The illustrated radio frequency module 30 includes a SAW component 32 and other circuitry 33. The SAW component 32 includes the SAW filter 37. The SAW filter 37 may be a ladder filter or a longitudinal mode filter. The SAW component 32 may include a SAW die including SAW resonators, for example.

The SAW component 32 illustrated in FIG. 7 includes one or more SAW filters 37, and terminals 35A and 35B. The one or more SAW filter 37 includes SAW resonators. The terminals 35A and 35B can serve, for example, as an input contact and an output contact. Although two terminals are illustrated, any suitable number of terminals can be implemented for a particular application. The SAW component 32 and the other circuitry 33 are on a common packaging substrate 36 in FIG. 7. The package substrate 36 can be a laminate substrate. The terminals 35A and 35B can be electrically connected to contacts 37A and 37B, respectively, on the packaging substrate 36 by way of electrical connectors 38A and 38B, respectively. The electrical connectors 38A and 38B can be bumps or wire bonds, for example.

The other circuitry 33 can include any suitable additional circuitry. For example, the other circuitry can include one or more power amplifiers, one or more radio frequency switches, one or more additional filters, one or more low noise amplifiers, one or more RF couplers, one or more delay lines, one or more phase shifters, the like, or any suitable combination thereof. The other circuitry 33 is electrically connected to the SAW component 32. The radio frequency module 30 can include one or more packaging structures to, for example, provide protection and/or facilitate easier handling of the radio frequency module 30. Such a packaging structure can include an overmold structure formed over the packaging substrate 36. The overmold structure can encapsulate some or all of the components of the radio frequency module 30.

Figure 8:
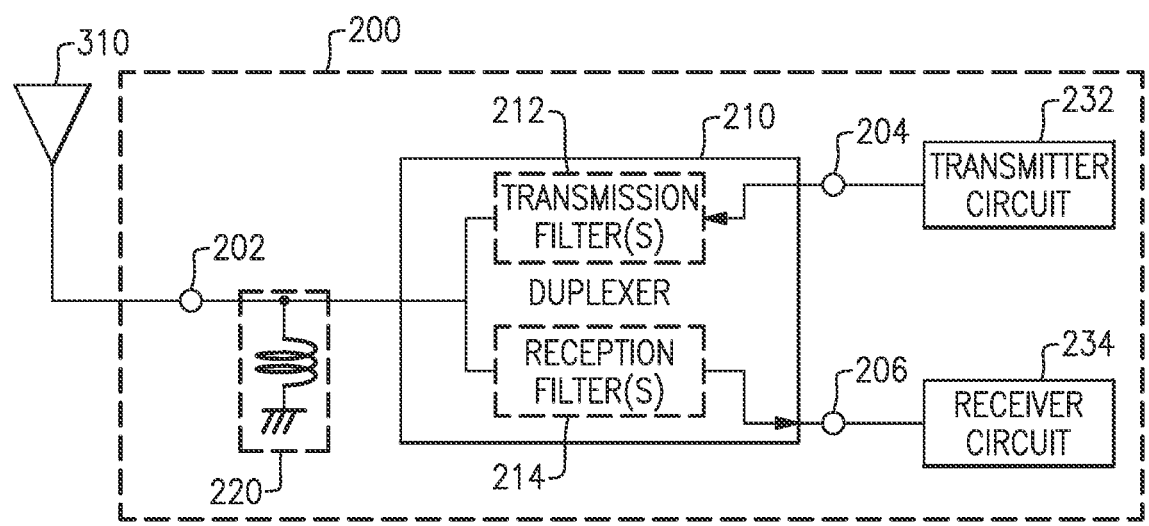
FIG. 8 is a schematic diagram of a front end module according to an embodiment of the present disclosure.

FIG. 8 is a block diagram illustrating a schematic configuration of one example of front-end module 200, which may be used in a configuration such as a wireless device for mobile communications, for example. The front-end module 200 includes a duplexer 210 having a common node 202, an input node 204 and an output node 206. An antenna 310 is connected to the common node 202. An inductive element 220 may optionally be electrically coupled between the common node 202 and ground.

The duplexer 210 may include one or more transmit filters 212 connected between the input node 204 and the common node 202, and one or more receive filters 214 connected between the common node 202 and the output node 206. The passband(s) of the transmit filter(s) 212 are different from the passband(s) of the receive filter(s) 214. Examples of SAW resonators according to embodiments disclosed herein can be included in the transmit filter(s) 212 and/or the receive filter(s) 214. For example, the radio frequency module 30 of FIG. 7 in which a SAW resonator according to an embodiment disclosed herein is included can be used in the transmit filter(s) 212 and/or the receive filter(s) 214.

The front-end module 200 further includes a transmitter circuit 232 connected to the input node 204 of the duplexer 210 and a receiver circuit 234 connected to the output node 206 of the duplexer 210. The transmitter circuit 232 can generate signals for transmission via the antenna 310, and the receiver circuit 234 can receive signals via the antenna 310 and process the received signals. In some embodiments, the receiver circuit 234 and the transmitter circuit 232 are implemented as separate circuits, as illustrated in FIG. 8; however, in other embodiments, these components may be integrated into a common transceiver circuit or module. As will be appreciated by those skilled in the art, the front-end module 200 may include other components that are not illustrated in FIG. 8 including, but not limited to, switches, electromagnetic couplers, amplifiers, processors, and the like.

Figure 9:
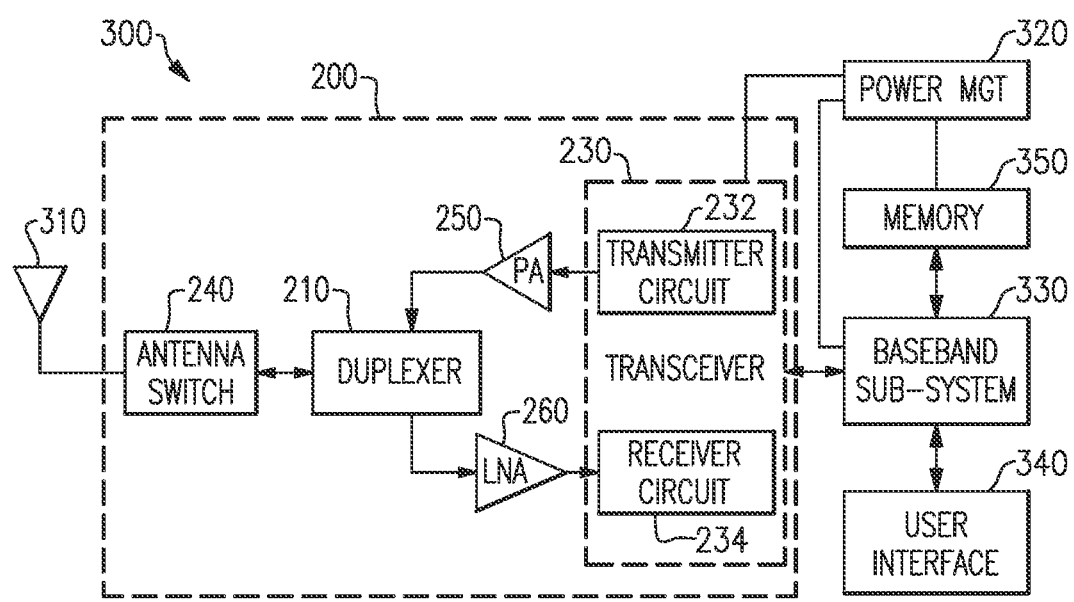
FIG. 9 is a schematic diagram of a wireless device according to an embodiment of the present disclosure.

FIG. 9 is a block diagram illustrating an example configuration of a wireless device 300 that includes the duplexer 210 of FIG. 8. The wireless device 300 can be a cellular phone, smart phone, tablet, modem, communication network or any other portable or non-portable device configured for voice or data communication. The wireless device 300 can receive and transmit signals from the antenna 310. The wireless device 300 may include an embodiment of a front-end module 200 similar to that discussed above with reference to FIG. 8. The front-end module 200 includes the duplexer 210, as discussed above. In the example illustrated in FIG. 9, the front end module 200 further includes an antenna switch 240, which can be configured to switch between different frequency bands or modes, such as transmit and receive modes, for example. In the example illustrated in FIG. 9, the antenna switch 240 is positioned between the duplexer 210 and the antenna 310; however, in other examples, the duplexer 210 can be positioned between the antenna switch 240 and the antenna 310. In other examples, the antenna switch 240 and the duplexer 210 can be integrated into a single component.

The front-end module 200 includes a transceiver 230 that is configured to generate signals for transmission or to process received signals. The transceiver 230 can include the transmitter circuit 232, which can be connected to the input node 204 of the duplexer 210, and the receiver circuit 234, which can be connected to the output node 206 of the duplexer 210, as illustrated in the example of FIG. 9.

Signals generated for transmission by the transmitter circuit 232 are received by a power amplifier (PA) module 250, which amplifies the generated signals from the transceiver 230. The power amplifier module 250 can include one or more power amplifiers. The power amplifier module 250 can be used to amplify a wide variety of radio frequency (RF) or other frequency-band transmission signals. For example, the power amplifier module 250 can receive an enable signal that can be used to pulse the output of the power amplifier to aid in transmitting a wireless local area network (WLAN) signal or any other suitable pulsed signal. The power amplifier module 250 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 250 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 9, the front-end module 200 may further include a low noise amplifier (LNA) module 260, which amplifies received signals from the antenna 310 and provides the amplified signals to the receiver circuit 234 of the transceiver 230.

The wireless device 300 of FIG. 9 further includes a power management (MGT) sub-system 320 that is connected to the transceiver 230 and manages the power for the operation of the wireless device 300. The power management system 320 can also control the operation of a baseband sub-system 330 and various other component of the wireless device 300. The power management system 320 can include, or can be connected to, a battery (not shown) that supplies power for the various components of the wireless device 300. The power management system 320 can further include one or more processors or controllers that can control the transmission of signals, for example. In one embodiment, the baseband sub-system 330 is connected to a user interface 340 to facilitate various input and output of voice and/or data provided to and received from the user. The baseband sub-system 330 can also be connected to memory 350 that is configured to store data and/or instructions to facilitate the operation of the wireless device, and/or to provide storage of information for the user. Any of the principles and advantages discussed herein can be implemented in association with RF circuits configured to process signals in a range from about 30 kHz to 300 GHz.

Aspects of this disclosure can be implemented in various electronic devices. Examples of the electronic devices can include, but are not limited to, consumer electronic products, parts of the consumer electronic products such as chips and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a vehicular electronics system such as an automotive electronics system, a microwave, a refrigerator, a stereo system, a digital music player, a camera such as a digital camera, a portable memory chip, a household appliance, etc. Further, the electronic devices can include unfinished products.

Conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application.

While certain embodiments have been described, these embodiments have been presented by way of example only and are not intended to limit the scope of the disclosure. Indeed, the novel devices, chips, methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

The invention claimed is:

1. A surface acoustic wave resonator comprising:
a piezoelectric substrate;
interdigital transducer electrodes formed on an upper surface of the piezoelectric substrate, the interdigital transducer electrodes including a bus bar electrode region, a gap region, and an overlapping region arranged in a transverse direction to a propagation direction of a surface acoustic wave to be excited;
a temperature compensation layer of dielectric formed on the upper surface of the piezoelectric substrate to cover the interdigital transducer electrodes;
a passivation layer of dielectric covering the temperature compensation layer, the passivation layer including an oxide layer configured to have a sound velocity greater than that of the temperature compensation layer and suppress a transverse signal transmission; and
an intermediate layer formed of silicon oxynitride covering the temperature compensation layer, the passivation layer covering the intermediate layer, the intermediate layer including a trench region in which a recessed trench is formed by a thickness of the intermediate layer reduced within a certain area extending in the transverse direction and including the gap region in the interdigital transducer electrodes.

2. The surface acoustic wave resonator of claim 1 wherein the oxide layer includes a trench region in which a recessed trench is formed by a thickness of the oxide layer reduced within a certain area extending in the transverse direction and including the gap region in the interdigital transducer electrodes.

3. The surface acoustic wave resonator of claim 2 wherein the trench region in the oxide layer includes the gap region and respective areas in the bus bar region and the overlapping region adjacent to the gap region respectively by a certain distance from the gap region in the transverse direction.

4. The surface acoustic wave resonator of claim 1 wherein the trench region includes the gap region and respective areas in the bus bar region and the overlapping region adjacent to the gap region respectively by a certain distance from the gap region in the transverse direction.

5. The surface acoustic wave resonator of claim 1 wherein the piezoelectric substrate is formed of lithium niobate.

6. The surface acoustic wave resonator of claim 1 wherein the temperature compensation layer is formed of silicon oxide.

7. The surface acoustic wave resonator of claim 1 wherein the oxide layer is formed of aluminum oxide.

8. The surface acoustic wave resonator of claim 1 wherein the interdigital transducer electrodes include molybdenum.

9. The surface acoustic wave resonator of claim 8 wherein the interdigital transducer electrodes include aluminum deposited on molybdenum.

10. A filter including a surface acoustic wave resonator comprising:
a piezoelectric substrate;
interdigital transducer electrodes formed on an upper surface of the piezoelectric substrate, the interdigital transducer electrodes including a bus bar electrode region, a gap region, and an overlapping region arranged in a transverse direction to a propagation direction of a surface acoustic wave to be excited;
a temperature compensation layer of dielectric formed on the upper surface of the piezoelectric substrate to cover the interdigital transducer electrodes;
a passivation layer of dielectric covering the temperature compensation layer, the passivation layer including an oxide layer configured to have a sound velocity greater than that of the temperature compensation layer and suppress a transverse signal transmission; and
an intermediate layer formed of silicon oxynitride covering the temperature compensation layer, the passivation layer covering the intermediate layer, the intermediate layer including a trench region in which a recessed trench is formed by a thickness of the intermediate layer reduced within a certain area extending in the transverse direction and including the gap region in the interdigital transducer electrodes.

11. The filter of claim 10 wherein the filter is a ladder filter.

12. The filter of claim 10 wherein the filter is a longitudinal mode filter.

13. The filter of claim 10 wherein the oxide layer includes a trench region in which a recessed trench is formed by a thickness of the oxide layer reduced within a certain area extending in the transverse direction and including the gap region in the interdigital transducer electrodes.

14. The filter of claim 13 wherein the trench region in the oxide layer includes the gap region and respective areas in the bus bar region and the overlapping region adjacent to the gap region respectively by a certain distance from the gap region in the transverse direction.

15. A wireless device that communicates by a frequency division bidirectional communication at a radio frequency, the wireless device including a duplexer comprising:
a transmit filter; and
a receive filter, at least one of the transmit filter and the receive filter including a filter having a surface acoustic wave resonator with
a piezoelectric substrate,
interdigital transducer electrodes formed on an upper surface of the piezoelectric substrate, the interdigital transducer electrodes including a bus bar electrode region, a gap region, and an overlapping region arranged in a transverse direction to a propagation direction of a surface acoustic wave to be excited,
a temperature compensation layer of dielectric formed on the upper surface of the piezoelectric substrate to cover the interdigital transducer electrodes,
a passivation layer of dielectric covering the temperature compensation layer, the passivation layer including an oxide layer configured to have a sound velocity greater than that of the temperature compensation layer and suppress a transverse signal transmission, and
an intermediate layer formed of silicon oxynitride covering the temperature compensation layer, the passivation layer covering the intermediate layer, the intermediate layer including a trench region in which a recessed trench is formed by a thickness of the intermediate layer reduced within a certain area extending in the transverse direction and including the gap region in the interdigital transducer electrodes.

* * * * *